(12) United States Patent
Na et al.

(10) Patent No.: US 8,924,679 B2
(45) Date of Patent: Dec. 30, 2014

(54) MEMORY DEVICE AND MEMORY SYSTEM INCLUDING THE SAME

(75) Inventors: Hyoung-Jun Na, Gyeonggi-do (KR); Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 606 days.

(21) Appl. No.: 13/204,937

(22) Filed: Aug. 8, 2011

(65) Prior Publication Data
US 2012/0254528 A1  Oct. 4, 2012

(30) Foreign Application Priority Data

Mar. 28, 2011  (KR) ........................ 10-2011-0027541

(51) Int. Cl.
| | | |
|---|---|---|
| *G06F 12/00* | (2006.01) | |
| *G06F 12/06* | (2006.01) | |
| *G06F 13/00* | (2006.01) | |
| *G06F 13/28* | (2006.01) | |

(52) U.S. Cl.
CPC ............... *G06F 12/00* (2013.01); *G06F 13/28* (2013.01); *G06F 12/0607* (2013.01); *G06F 13/00* (2013.01); *G11C 2207/2281* (2013.01); *G11C 2207/107* (2013.01)
USPC ...... 711/167; 711/105; 710/35; 365/189.011; 365/230.03

(58) Field of Classification Search
CPC .............. G06F 13/28; G11C 2207/107; G11C 2207/2281
USPC ............. 711/105, 167; 710/35; 365/189.011, 365/230.03
See application file for complete search history.

(56) References Cited

U.S. PATENT DOCUMENTS

| | | | | |
|---|---|---|---|---|
| 5,715,476 A | * | 2/1998 | Kundu et al. ................... | 710/35 |
| 6,084,823 A | * | 7/2000 | Suzuki et al. ............ | 365/230.03 |
| 6,185,149 B1 | * | 2/2001 | Fujioka et al. ........... | 365/233.18 |

FOREIGN PATENT DOCUMENTS

| | | |
|---|---|---|
| KR | 1020010070356 | 7/2001 |
| KR | 100723889 | 5/2007 |
| KR | 1020080024786 | 3/2008 |
| KR | 1020090016168 | 2/2009 |
| KR | 1020090126607 | 12/2009 |

* cited by examiner

*Primary Examiner* — Sanjiv Shah
*Assistant Examiner* — Mark Giardino, Jr.
(74) *Attorney, Agent, or Firm* — IP & T Group LLP (57) ABSTRACT

A memory device includes a first bank group, a second bank group, where the first and second bank groups are each configured to output multi-bit data in parallel in response to a read command, a data transferor configured to receive the multi-bit data outputted in parallel from the first bank group or the second bank group and output the multi-bit data at a time interval corresponding to an operation mode, first global data buses configured to transfer the multi-bit data outputted from the first bank group to the data transferor, second global data buses configured to transfer the multi-bit data outputted from the second bank group to the data transferor, and a parallel-to-serial converter configured to convert the multi-bit data outputted from the data transferor into serial data according to the operation mode.

21 Claims, 6 Drawing Sheets

MEMORY DEVICE AND MEMORY SYSTEM INCLUDING THE SAME

CROSS-REFERENCE TO RELATED APPLICATIONS

The present application claims priority of Korean Patent Application No. 10-2011-0027541, filed on Mar. 28, 2011, which is incorporated herein by reference in its entirety.

BACKGROUND

1. Field

Exemplary embodiments of the present invention relate to a memory device and a memory system including a memory controller for controlling the memory device.

2. Description of the Related Art

As semiconductor-related technology advances, the operation speed of semiconductor memory devices increases. An example of semiconductor memory devices is a Synchronous Dynamic Random Access Memory (SDRAM), which operates in synchronization with an external clock. SDRAM may use a Double Data Rate scheme to increase a data transfer rate by inputting/outputting data in synchronization with not only a rising edge of a clock but also a falling edge of the clock as well. This DDR SDRAM technology used in DDR2 and DDR3 schemes is an improvement over a DDR1 scheme. In case of DDR1, a two-bit prefetch is performed and an input/output data has a burst length (BL) of 2, and in case of DDR2, a 4-bit prefetch is performed and an input/output data has a burst length (BL) of 4. In case of DDR3, an 8-bit prefetch is performed and an input/output data has a burst length (BL) of 8. Here, the burst length (BL) of an input/output data being 8 indicates that 8-bit data which is synchronized with a clock are consecutively inputted/outputted through one data input/output pad.

When a memory device performs a read operation of receiving a read command and outputting a stored data in response to the read command, it takes some time for the data stored in a memory cell region to be outputted to outside the memory device through an internal circuit. Thus, read commands applied from outside is to be applied with a minimum time interval, which is a CAS to CAS delay time (tCCD). For example, when a DDR3 SDRAM performs a read operation with a burst length of 8 (BL8), the time interval between the read commands that are applied consecutively may be at least 4tCK.

Figure 1:
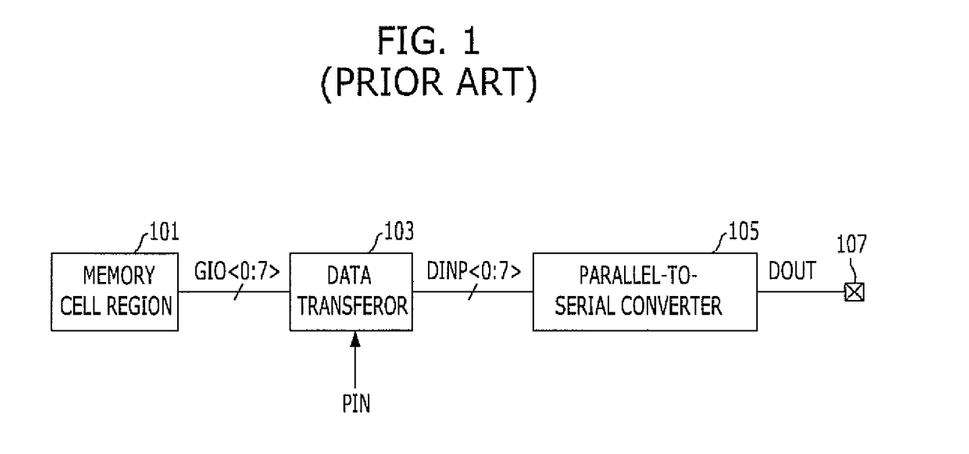
FIG. 1 is a block view illustrating a data output path of a conventional memory device.

FIG. 1 is a block view illustrating a data output path of a conventional memory device. Here, it is assumed that the memory device is a DDR3 SDRAM device.

Referring to FIG. 1, the conventional memory device includes a memory cell region 101, global data buses GIO<0:7>, a data transfer unit 103, a parallel-to-serial converter 105, and a data output pad 107. Here, FIG. 1 illustrates a structure between the memory cell region 101 and a data output pad 107, where a memory device may have a number of such structures equal to a number of data output pads.

When a read command is applied to the memory device, multi-bit parallel data stored in the memory cell region 101 are transferred to the data transfer unit 103 through the global data buses GIO<0:7>. The data transfer unit 103 receiving the transferred data latches the transferred parallel data and when an output signal PIN is enabled, transfers the latched data to the parallel-to-serial converter 105 through DOUTP<0:7>. The parallel-to-serial converter 105 converts the received parallel data into serial data and outputs the serial data through the data output pad 107.

The DDR3 SDRAM device is designed to perform a burst length 8 (BL8) operation, but it may support a BL4 operation as well. Hereafter, the DDR3 SDRAM is described with reference to FIGS. 2A and 2B.

Figure 2A:
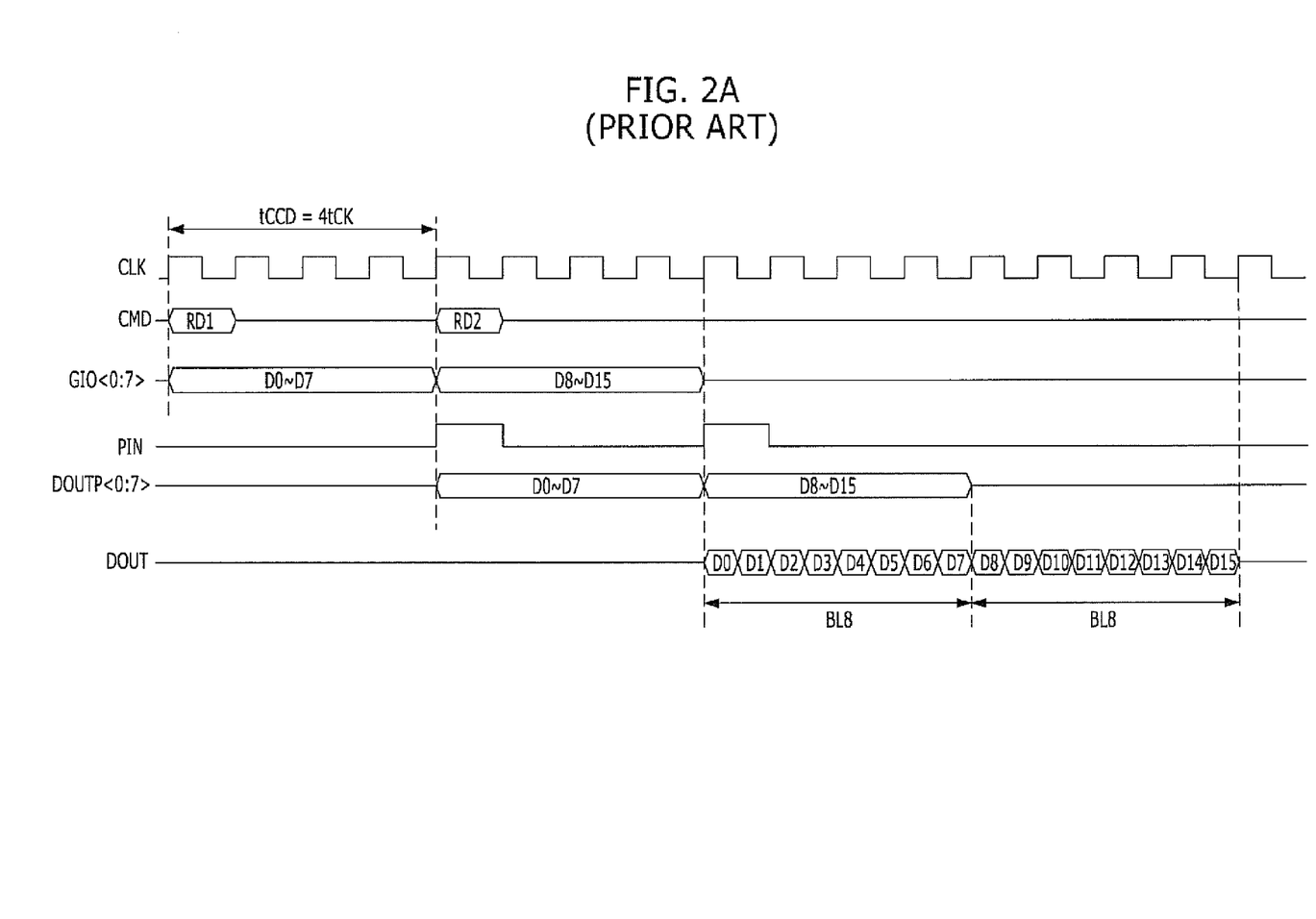
FIG. 2A is an operation timing diagram of a burst length 8 (BL8) read operation of the memory device shown in FIG. 1.

FIG. 2A is an operation timing diagram of a burst length 8 (BL8) read operation of the memory device shown in FIG. 1.

Here, a timing when a read command is applied and a timing when data are outputted to the global data buses GIO<0:7> corresponding to the read command application moment are shown to be the same for illustration purposes. In an actual environment, a read command is applied first, and after a time equal to a CAS latency elapses, the data corresponding to the read command are outputted.

Referring to FIG. 2A, when the DDR3 SDRAM device performs a BL8 read operation, read commands RD1 and RD2 are applied at an interval of 4 tCK, and 8-bit parallel data D0 to D7 and D8 to D15 which respectively correspond to the read commands RD1 and RD2 are outputted from the memory cell region 101 and transferred to the data transfer unit 103 through the global data buses GIO<0:7>. The data transfer unit 103 latches the received 8-bit parallel data D0 to D7 and D8 to D15 and transfers the latched data to the DOUTP<0:7> at a timing when the output signal PIN is enabled to a logic high level. The output signal PIN is enabled at the interval of 4 tCK. The parallel-to-serial converter 105 converts the 8-bit parallel data D0 to D7 and D8 to D15, which are transferred at every 4 tCK, into serial data, and the serial data D0, D1, ..., D7/D8, D9, ..., D15 are outputted to outside the memory device through the data output pad 107.

Figure 2B:
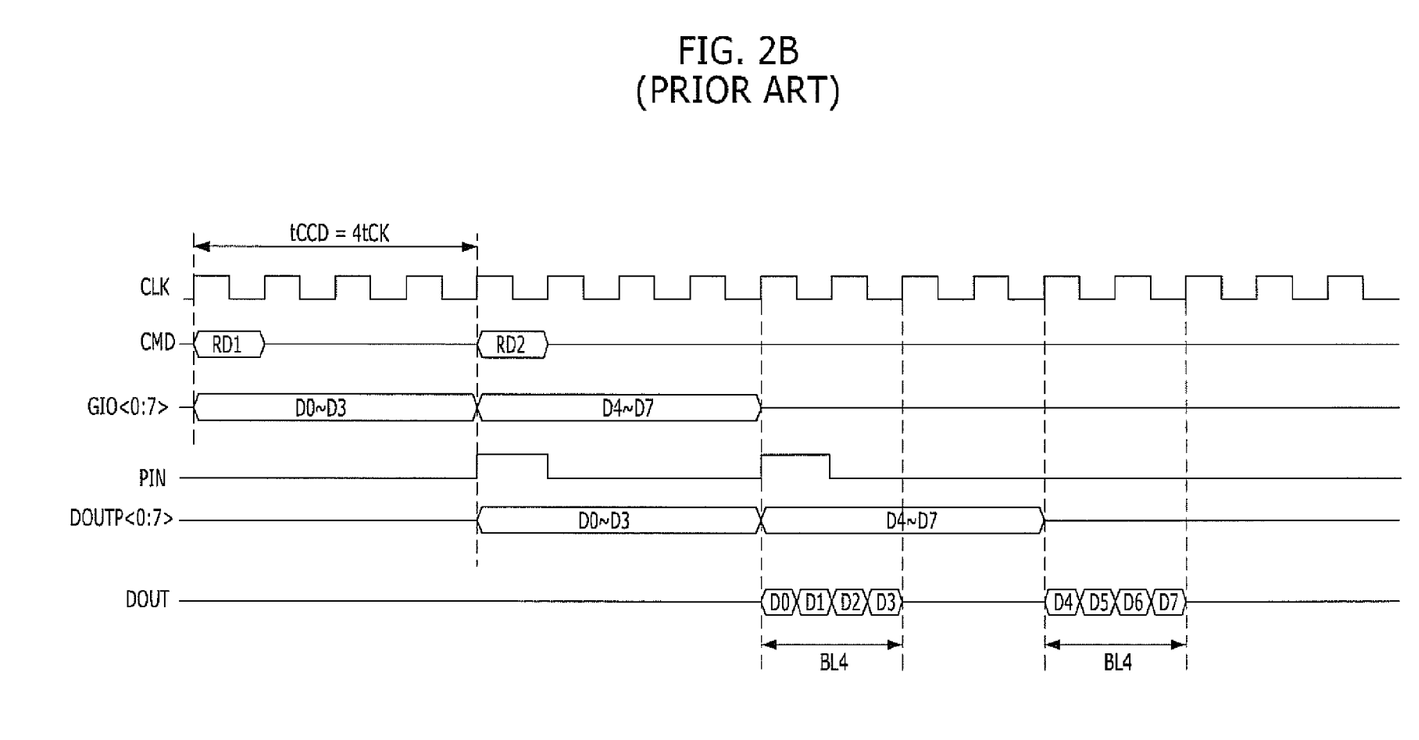
FIG. 2B is an operation timing diagram of a burst length 4 (BL4) read operation of the memory device shown in FIG. 1.

FIG. 2B is an operation timing diagram of a burst length 4 (BL4) read operation of the memory device shown in FIG. 1.

Referring to FIG. 2B, when the DDR3 SDRAM device performs a BL4 read operation, 4-bit parallel data D0 to D3 and D4 to D7 which respectively correspond to the read commands RD1 and RD2 are outputted from the memory cell region 101 and transferred to the data transfer unit 103 through the global data buses GIO<0:7>. The data transfer unit 103 latches the received 4-bit parallel data D0 to D3 and D4 to D7 and transfers the latched data to the DOUTP<0:7> at a timing when the output signal PIN is enabled to a logic high level. Here, according to an example, only four lines of the global data buses GIO<0:7> and only four lines of the DOUTP<0:7> may be used. The output signal PIN is enabled at the interval of 4 tCK. The parallel-to-serial converter 105 converts the 8-bit parallel data D0 to D3 and D4 to D7, which are transferred at every 4 tCK, into serial data, and the serial data D0, D1, D2, D3/D4, D5, D6, D7 are outputted to outside the memory device through the data output pad 107.

Here, to obtain the same data output efficiency of the BL8 operation during the BL4 operation, the read commands RD1 and RD2 may be applied at half the interval used for the BL8 (that is, 2 tCK). However, a minimum time to physically read and transfer read the data recorded in a memory cell through the global data buses GIO<0:7>, which may have significant parasitic capacitance and parasitic resistance, may be longer (for example, 4 tCK) than 2 tCK. When the minimum time to physically read and transfer data recorded in a memory cell equals 4tCK, the read commands RD1 and RD2 are to be applied with a time interval of at least tCCD, which is 4 tCK, during the BL4 operation.

Here, since the consecutive read commands RD1 and RD2 are to be applied at the interval of 4 tCK during the BL4 operation of the conventional memory device as in the BL8 operation, data is not output for 2 tCK period of each 4 tCK interval in the memory device. Therefore, the data transfer efficiency is decreased by half as compared with the BL8 operation.

SUMMARY

An embodiment of the present invention is directed to a memory device that may significantly increase the data output efficiency during a read operation despite constraints in data output characteristics of a memory cell or the data transfer characteristics of global data buses, and a memory system including the memory device.

In accordance with an embodiment of the present invention, a memory system includes: a memory device configured to output data of a burst length, wherein the burst length corresponds to an operation mode of the memory device when a read command is applied; and a controller configured to control the burst length and a time interval that the read command is consecutively applied to the memory device according to the operation mode.

In accordance with another embodiment of the present invention, a memory device includes: a first bank group; a second bank group, wherein the first and second bank groups are each configured to output multi-bit data in parallel in response to a read command; a data transferor configured to receive the multi-bit data outputted in parallel from the first bank group or the second bank group and output the multi-bit data at a time interval corresponding to an operation mode; first global data buses configured to transfer the multi-bit data outputted from the first bank group to the data transferor; second global data buses configured to transfer the multi-bit data outputted from the second bank group to the data transferor; and a parallel-to-serial converter configured to convert the multi-bit data outputted from the data transferor into serial data according to the operation mode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
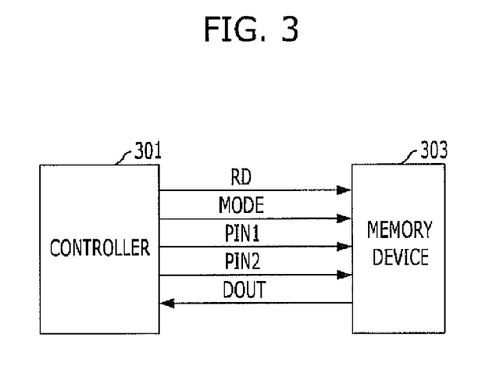
FIG. 3 is a block view illustrating a memory system in accordance with an embodiment of the present invention.

FIG. 3 is a block view illustrating a memory system in accordance with an embodiment of the present invention.

Referring to FIG. 3, the memory system includes a memory device 303 for outputting data of a burst length corresponding to an operation mode when a read command is applied and a controller 301 for controlling a burst length and time interval for applying read commands to the memory device 303 according to the operation mode.

The controller 301 applies a read command RD, a mode signal MODE, and first and second input signals PIN1 and PIN2 to the memory device 303. The memory device 303 outputs data DOUT at different time intervals and burst lengths according to different operation modes. Here, the mode signal MODE is a signal for deciding the operation mode of the memory device 303, and the first and second input signals PIN1 and PIN2 are signals for deciding the transfer timing of the data, according to the operation mode, at a data output path within the memory device 303.

The operation mode of the memory device 303 may be divided into a first burst mode and a second burst mode, and the controller 301 may apply the read command RD at a time interval corresponding to each operation mode. With respect to a Double Data Rate 3 Synchronous Dynamic Random Access Memory (DDR3 SDRAM) device, for example, the DDR3 SDRAM device may perform a burst length 8 (BL8) operation in a first burst mode and perform a burst length 4 (BL4) operation in a second burst mode. According to exemplary embodiment, the controller 301 applies read commands at a time interval of 4 tCK during the first burst mode (BL8) operation and applies read commands at a time interval of 2 tCK during the second burst mode (BL4) operation to thereby improve the operation rate and data output rate of the memory system. Hereafter, the structure of the memory device 303 is described in detail.

Figure 4:
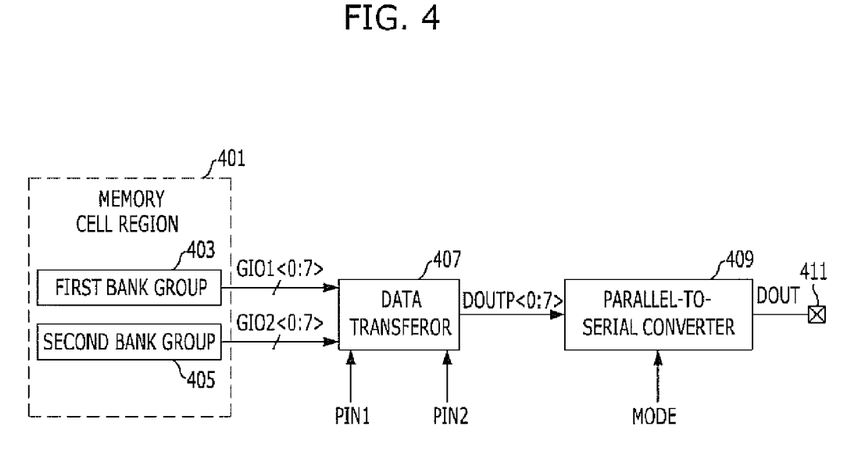
FIG. 4 is a block view illustrating a memory device 303 shown in FIG. 3.

FIG. 4 is a block view illustrating a memory device 303 shown in FIG. 3.

Referring to FIG. 4, the memory device 303 includes a memory cell region 401, a data transferor 407, first global data buses GIO1<0:7>, second global data buses GIO2<0:7>, a parallel-to-serial converter 409, and a data output pad 411. The memory cell region 401 includes a first bank group 403 and a second bank group 405. The data transferor 407 receives multi-bit data outputted in parallel from the first bank group 403 or the second bank group 405 in response to a read command and outputs the multi-bit parallel data at a time interval corresponding to an operation mode. The first global data buses GIO1<0:7> transfers the data outputted from the first bank group 403 to the data transferor 407. The second global data buses GIO2<0:7> transfers the data outputted from the second bank group 405 to the data transferor 407. The parallel-to-serial converter 409 converts the data outputted from the data transferor 407 into serial data, where the conversion timing and the number of bits of the converted data are controlled according to the operation mode.

Here, FIG. 4 shows a structure between the memory cell region 401 and a data output pad 411, where the memory device 303 may have a number of such structures equal to a number of the data output pads in the memory device 303. According to an example, each of the first bank group 403 and the second bank group 405 in the memory cell region 401 may include two or more banks (not shown).

In this embodiment of the present invention, it is assumed that the memory device 303 is a DDR3 SDRAM. Therefore, as described before, the memory device 303 may support both BL8 operation and BL4 operation.

In the first burst mode (BL8) operation, whenever a read command is applied, 8-bit parallel data are outputted from a bank group selected between the first bank group 403 and the second bank group 405 and transferred to the data transferor 407 through the first global data buses GIO1<0:7> and the second global data buses GIO2<0:7>.

During the second burst mode (BL4) operation, whenever a read command is applied, 4-bit data are outputted alternately from the first bank group 403 and the second bank group 405 and transferred alternately through the first global data buses GIO1<0:7> and the second global data buses GIO2<0:7>.

The data transferor 407 operates in response to the first and second input signals PIN1 and PIN2. The data transferor 407 latches the parallel data transferred through the first global data buses GIO1<0:7> and the second global data buses GIO2<0:7> and transfers the parallel data to DOUTP<0:7> at a time interval corresponding to the operation mode. More specifically, when the bank group selected in response to a read command is the first bank group 403, the first input signal PIN1 is enabled to a logic high level and the data transferred through the first global data buses GIO1<0:7> are transferred to the DOUTP<0:7>. When the bank group selected in response to a read command is the second bank group 405, the second input signal PIN2 is enabled to a logic high level and the data transferred through the second global data buses GIO2<0:7> are transferred to the DOUTP<0:7>. Here, the first and second input signals PIN1 and PIN2 may be enabled at a time interval of 4 tCK during the first burst mode (BL8) operation, where they may be enabled alternately at a time interval of 2 tCK during the second burst mode (BL4) operation.

The parallel-to-serial converter 409 operates in response to the mode signal MODE and converts the parallel data transferred from the DOUTP<0:7> into serial data at a time interval corresponding to the operation mode. The mode signal MODE has a high level in the first burst mode (BL8) and has a low level in the second burst mode (BL4). The serial data are outputted to outside the memory device 303 through the data output pad 411.

Hereafter, the operation of each operation mode is described in detail with reference to FIGS. 5A and 5B.

Figure 5A:
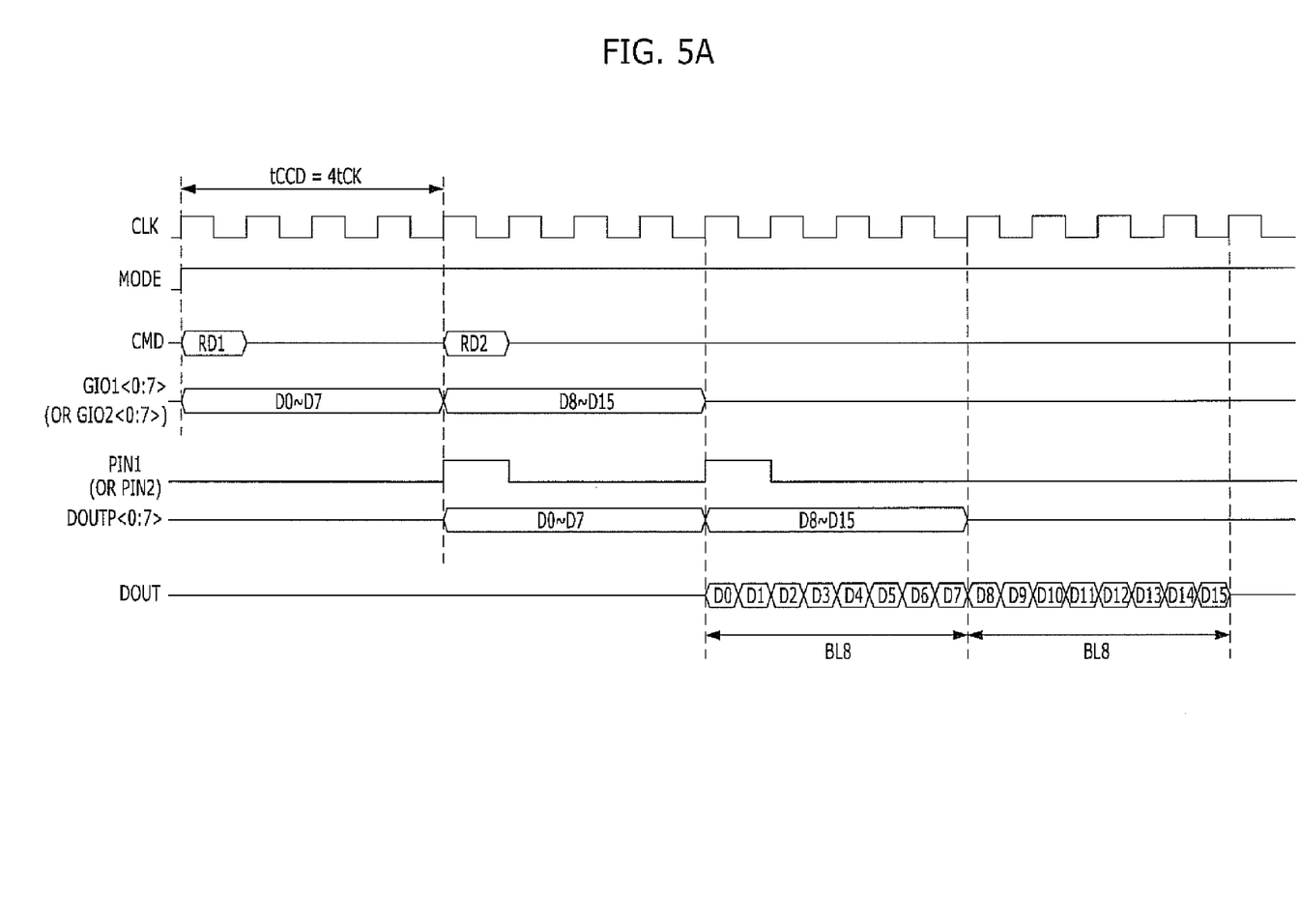
FIG. 5A is an operation timing diagram of a first burst mode (BL8) operation of the memory system in accordance with the embodiment of the present invention.

FIG. 5A is an operation timing diagram of a first burst mode (BL8) operation of the memory system in accordance with the embodiment of the present invention.

During the first burst mode (BL8) operation, the time interval that read commands RD1 and RD2 are consecutively applied is 4 tCK, and whenever each of the read commands RD1 and RD2 is applied, 8-bit parallel data D0 to D7 and D8 to D15 are outputted from a bank group selected between the first bank group 403 and the second bank group 405. The outputted 8-bit parallel data D0 to D7 and D8 to D15 are transferred to the data transferor 407 through data buses corresponding to the selected bank group (that is, either the first global data buses GIO1<0:7> or the second global data buses GIO2<0:7>).

The data transferor 407 transfers the 8-bit parallel data D0 to D7 or D8 to D15 that are transferred when the first input signal PIN1 or the second input signal PIN2 is enabled, respectively, to the DOUTP<0:7>. Here, when the data are transferred through the first global data buses GIO1<0:7>, the first input signal PIN1 is enabled to a logic high level, and when the data are transferred through the second global data buses GIO2<0:7>, the second input signal PIN2 is enabled to a logic high level. The first input signal PIN1 and the second input signal PIN2 are enabled at a time interval of 4 tCK.

The parallel-to-serial converter 409 converts the 8-bit parallel data D0 to D7 and D8 to D15 transferred through the DOUTP<0:7> at a time interval of 4 tCK in response to the mode signal MODE of a logic high level into serial data D0, D1, . . . , D7/D8, D9, . . . , D15. The serial data D0, D1, . . . , D7/D8, D9, . . . , D15 are outputted to outside the memory device 303 through the DOUT and the data output pad 411.

Figure 5B:
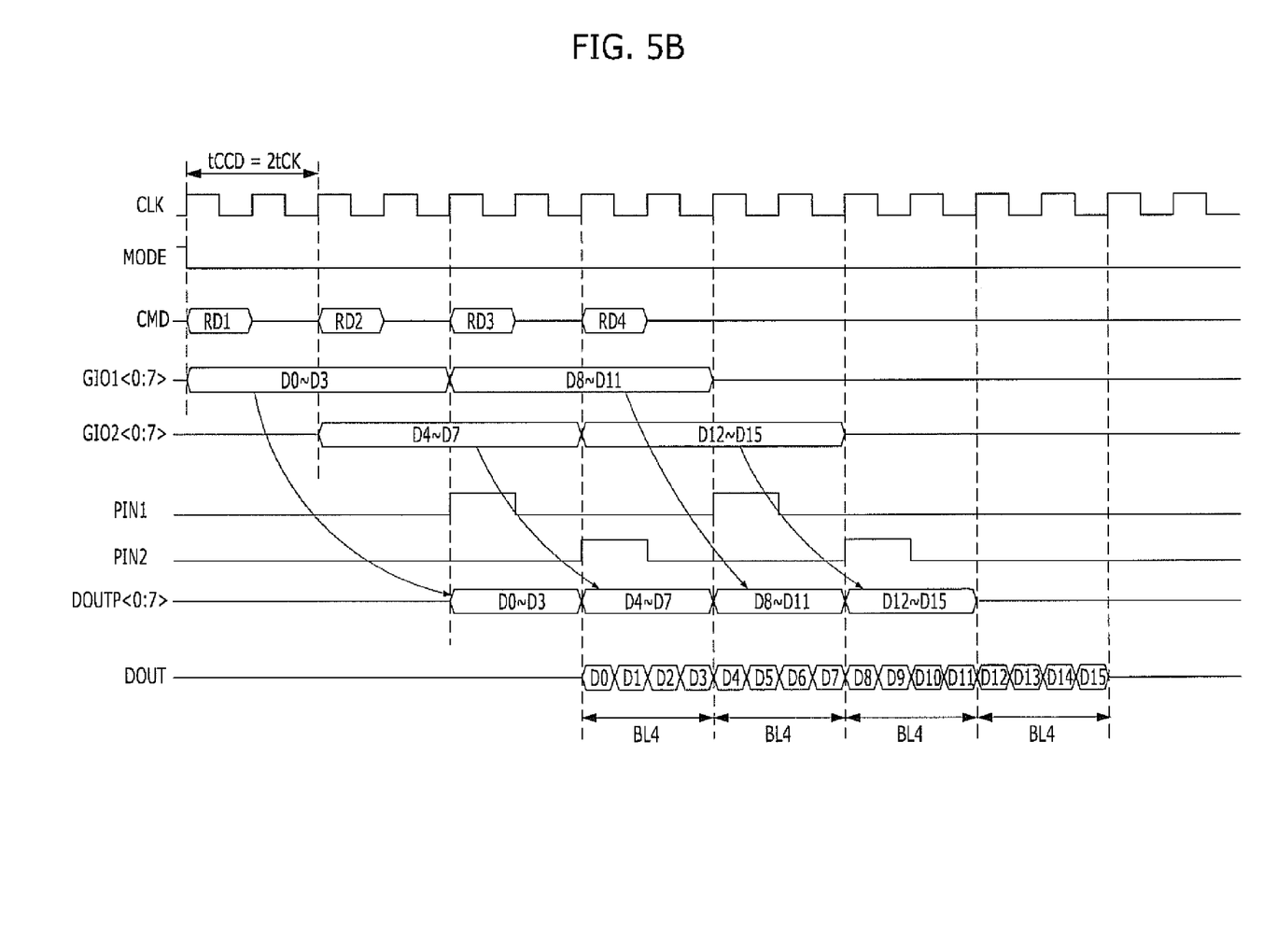
FIG. 5B is an operation timing diagram of a second burst mode (BL4) operation of the memory system in accordance with the embodiment of the present invention.

FIG. 5B is an operation timing diagram of a second burst mode (BL4) operation of the memory system in accordance with the embodiment of the present invention.

During the second burst mode (BL4) operation, read commands RD1, RD2, RD3 and RD4 are applied at a time interval of 2 tCK, which is half the time interval used for BL8 operation. Whenever the read commands RD1, RD2, RD3 and RD4 are applied, 4-bit parallel data D0 to D3, D4 to D7, D8 to D11 and D12 to D15 are outputted respectively, where subsequent 4-bit parallel data are alternately from the first bank group 403 and the second bank group 405. The outputted 4-bit parallel data D0 to D3, D4 to D7, D8 to D11 and D12 to D15 are transferred to the data transferor 407 at a time interval of 2tCK alternately through the first global data buses GIO1<0:7> and the second global data buses GIO2<0:7>, where the first global data buses GIO1<0:7> and the second global data buses GIO2<0:7> correspond to first and second bank groups, respectively.

The 4-bit parallel data D0 to D3, D4 to D7, D8 to D11 and D12 to D15 transferred to the data transferor 407 alternately through the first global data buses GIO1<0:7> and the second global data buses GIO2<0:7> are transferred to the DOUTP<0:7> at a time interval of 2tCK. Here, as illustrated in FIG. 5B, when the first input signal PIN1 is enabled, the data D0 to D3 or D8 to D11 transferred through the first global data buses GIO1<0:7> are transferred to the DOUTP<0:7>, and when the second input signal PIN2 is enabled, the data D4 to D7 or D12 to D15 transferred through the second global data buses GIO2<0:7> are transferred to the DOUTP<0:7>. According to an example, the first input signal PIN1 is enabled to a logic high level in response to the odd-number read commands R1 and R3, and the second input signal PIN2 is enabled to a logic high level in response to the even-number read commands R2 and R4.

According to an example, since the transferred parallel data are 4 bits, only four of the 8 lines for the first global data buses GIO1<0:7>, only four of the 8 lines for the second global data buses GIO2<0:7>, and only four of the 8 lines for the DOUTP<0:7> may be used.

The parallel-to-serial converter 409 converts the 4-bit parallel data D0 to D3, D4 to D7, D8 to D11 and D12 to D15 that are transferred through the DOUTP<0:7> at the time interval of 2 tCK in response to the mode signal MODE of a logic low level into serial data D0, D1, D2, D3/D4, D5, D6, D7/D8, D9, D10, D11/D12, D13, D14, D15. The obtained serial data D0, D1, D2, D3/D4, D5, D6, D7/D8, D9, D10, D11/D12, D13, D14, D15 are outputted to outside the memory device 303 through the DOUT and the data output pad 411.

As described above, the time interval for loading data on a global data bus is kept at 4tCK and all data may be properly outputted from the memory cell region 401 to outside the memory device 303 in response to the read commands inputted at the time interval of 2tCK. Therefore, the operation rate and data transfer efficiency are increased.

Here, while the DDR3 SDRAM performing an 8-bit prefetch has been illustrated as an example, the exemplary embodiments may be applied to different types of memory devices for outputting multi-bit data in bursts.

Also, while a case where the memory cell region 401 is divided into two bank groups has been illustrated as an example, the exemplary embodiments may be applied to different cases where data are transferred from two bank groups selected among the bank groups alternately through the corresponding global data buses.

According to an exemplary embodiment of the present invention, bank grouping and the time interval for applying read commands may be controlled based on the burst length of output data by controlling transfer of stored data to global data buses respectively corresponding to bank groups and output of the data. Here, a short burst length may be used, where stored data may be properly outputted even if the read commands are applied at a shorter time interval.

Also, when an operation is performed with a short burst length, the data output efficiency and operation rate of the memory device may be increased considerably by reducing the time interval for applying the read commands.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
    a first bank group;
    a second bank group, wherein the first and second bank groups are each configured to alternately output multi-bit data in parallel whenever a read command is applied;
    a data transferor configured to output the multi-bit data at a time interval corresponding to an operation mode in response to the multi-bit data outputted in parallel from the first bank group or the second bank group; and
    a parallel-to-serial converter configured to convert the multi-bit data outputted from the data transferor into serial data according to the operation mode,
    wherein during a first burst mode operation, whenever the read command is applied, parallel data of a first burst length are outputted from a bank group selected between the first bank group and the second bank group, and
    during a second burst mode operation, whenever the read command is applied, parallel data of a second burst length are outputted alternately from the first bank group and the second bank group,
    wherein the second burst length is a half of the first burst length.

2. The memory device of claim 1, wherein a time interval for applying the read command during the second burst mode operation is a half of a time interval for applying the read command during the first burst mode operation.

3. The memory device of claim 1, wherein the data transferor is configured to output the parallel data of the first burst length at a first time interval during the first burst mode operation in response to the parallel data of the first burst length, and
    output the parallel data of the second burst length at a second time interval during the second burst mode operation in response to the parallel data of the second burst length.

4. The memory device of claim 3, wherein the first time interval and the second time interval are each the same as a time interval for applying the read command in a corresponding one of the first and second burst operations modes.

5. The memory device of claim 1, wherein the parallel-to-serial converter is configured to convert the parallel data of the first burst length into serial data at a first time interval during the first burst mode operation, and
    convert the parallel data of the second burst length into serial data at a second time interval during the second burst mode operation.

6. The memory device of claim 1, wherein the data transfer is further configured to output the multi-bit data outputted from the first bank group or the second bank group in response to a first input signal enabled according to the operation mode and the parallel-to-serial converter is further configured to convert the multi-bit data outputted from the data transferor into serial data in response to a mode signal indicating the operation mode.

7. The memory device of claim 1, wherein the data transfer is further configured to output the multi-bit data outputted from the first bank group in response to the first input signal and output the multi-bit data outputted from the second bank group in response to a second input signal enabled according to the operation mode.

8. A memory system, comprising:
    a memory device configured to output data of a burst length, wherein the burst length corresponds to an operation mode of the memory device when a read command is applied; and
    a controller configured to control the burst length and a time interval that the read command is applied to the memory device according to the operation mode,
    wherein the memory device comprises:
        a first bank group;
        a second bank group, wherein the first and second bank groups are each configured to alternately output multi-bit data in parallel whenever a read command is applied;
        a data transferor configured to output the multi-bit data at a time interval corresponding to an operation mode in response to the multi-bit data outputted in parallel from the first bank group or the second bank group;
        first global data buses configured to transfer the multi-bit data outputted from the first bank group to the data transferor;
        second global data buses configured to transfer the multi-bit data outputted from the second bank group to the data transferor; and
        a parallel-to-serial converter configured to convert the multi-bit data outputted from the data transferor into serial data according to the operation mode,
    wherein the memory device is configured to output parallel data of a first burst length from a bank group selected between the first bank group and the second bank group whenever the read command is applied during a first burst mode operation, and
    output parallel data of a second burst length alternately from the first bank group and the second bank group whenever the read command is applied during a second burst mode operation,
    wherein the second burst length is a half of the first burst length.

9. The memory system of claim 8, wherein the controller is configured to apply the read command during the second burst mode operation at an interval equal to a half of a time interval used for applying the read command during the first burst mode.

10. The memory system of claim 8, wherein the data transferor is configured to output the parallel data of the first burst length at a first time interval during the first burst mode operation in response to the parallel data of the first burst length, and
    output the parallel data of the second burst length at a second time interval during the second burst mode operation in response to the parallel data of the second burst length.

11. The memory system of claim 10, wherein the first time interval and the second time interval are each the same as a time interval for applying the read command in a corresponding one of the first and second burst operations modes.

12. The memory system of claim 8, wherein the parallel-to-serial converter is configured to convert the parallel data of the first burst length into serial data at a first time interval during the first burst mode operation, and convert the parallel data of the second burst length into serial data at a second time interval during the second burst mode operation.

13. The memory system of claim 8, wherein the controller is configured to generate a mode signal corresponding to the operation mode and the parallel-to-serial converter is configured to operate in response to the mode signal.

14. The memory system of claim 8, wherein the controller is configured to enable a first input signal and a second input signal at a time interval corresponding to the operation mode, and the data transferor is configured to output data from the first global data buses when the first input signal is enabled, and output data from the second global data buses when the second input signal is enabled.

15. A memory device, comprising:
a first bank group;
a second bank group, wherein the first and second bank groups are each configured to alternately output multi-bit data in parallel whenever a read command is applied;
a data transferor configured to output the multi-bit data at a time interval corresponding to an operation mode in response to the multi-bit data outputted in parallel from the first bank group or the second bank group and;
first global data buses configured to transfer the multi-bit data outputted from the first bank group to the data transferor;
second global data buses configured to transfer the multi-bit data outputted from the second bank group to the data transferor; and
a parallel-to-serial converter configured to convert the multi-bit data outputted from the data transferor into serial data according to the operation mode,
wherein one of the first and second global data buses is configured to transfer the multi-bit data of the first burst length at a first time interval during the first burst mode operation, and
wherein the first and second global data buses are configured to alternately output the multi-bit data of the second burst length at a second time interval during the second burst mode operation,
wherein during a first burst mode operation, whenever the read command is applied, parallel data of a first burst length are outputted from the bank group selected between the first bank group and the second bank group, and during a second burst mode operation, whenever the read command is applied, parallel data of a second burst length are outputted alternately from the first bank group and the second bank group, wherein the second burst length is a half of the first burst length.

16. The memory device of claim 15, wherein a time interval for applying the read command during the second burst mode operation is a half of a time interval for applying the read command during the first burst mode operation.

17. The memory device of claim 15, wherein the data transferor is configured to output the parallel data of the first burst length at the first time interval during the first burst mode operation in response to the parallel data of the first burst length, and output the parallel data of the second burst length at the second time interval during the second burst mode operation in response to the parallel data of the second burst length.

18. The memory device of claim 17, wherein the first time interval and the second time interval are each the same as a time interval for applying the read command in a corresponding one of the first and second burst operations modes.

19. The memory device of claim 15, wherein the parallel-to-serial converter is configured to convert the parallel data of the first burst length into serial data at a first time interval during the first burst mode operation, and convert the parallel data of the second burst length into serial data at a second time interval during the second burst mode operation.

20. The memory device of claim 15, wherein the data transfer is further configured to output the multi-bit data outputted from the first bank group or the second bank group in response to a first input signal enabled according to the operation mode and the parallel-to-serial converter is further configured to convert the multi-bit data outputted from the data transferor into serial data in response to a mode signal indicating the operation mode.

21. The memory device of claim 15, wherein the data transfer is further configured to output the multi-bit data outputted from the first bank group in response to a first input signal and output the multi-bit data outputted from the second bank group in response to a second input signal enabled according to the operation mode.

* * * * *